(12) United States Patent
Boyd (10) Patent No.: US 6,326,718 B1
(45) Date of Patent: Dec. 4, 2001

(54) MULTILAYER PIEZOELECTRIC TRANSFORMER

(75) Inventor: Clark Davis Boyd, Hampton, VA (US)

(73) Assignee: Face Internatinal Corp., Norfolk, VA (US)

(*) Notice: Subject to any disclaimer, the term of this patent is extended or adjusted under 35 U.S.C. 154(b) by 0 days.

(21) Appl. No.: 09/586,304

(22) Filed: Jun. 2, 2000

Related U.S. Application Data (60) Provisional application No. 60/171,957, filed on Dec. 23, 1999.

(51) Int. Cl.[7] ........................ H01L 41/107; H01L 41/047
(52) U.S. Cl. ................................................. 310/359
(58) Field of Search ............................................ 310/359

(56) References Cited

U.S. PATENT DOCUMENTS 5,834,882 * 11/1998 Bishop ............................ 310/359
6,037,706 * 3/2000 Inoi et al. ....................... 310/359
6,124,678 * 9/2000 Bishop et al. ................ 315/209 PZ

FOREIGN PATENT DOCUMENTS 58-87885-A * 5/1983 (JP) ................................. 310/359
11-204852-A * 7/1997 (JP) ................................. 310/359
9-275231-A * 10/1997 (JP) ................................. 310/359
10-135532-A * 5/1998 (JP) ................................. 310/359
11-126929-A * 5/1999 (JP) ................................. 310/359

* cited by examiner

*Primary Examiner*—Thomas M. Dougherty
(74) *Attorney, Agent, or Firm*—Stephen E. Clark; David J. Bolduc

(57) ABSTRACT

A multilayer piezoelectric transformer is provided using the longitudinal vibration modes for step-up voltage conversion applications. An input portion polarized to deform in a longitudinal plane is bonded to an output portion. The deformation of the input portion is mechanically coupled to the output portion, which deforms in the same longitudinal direction relative to the input portion. The output portion is polarized in the thickness direction relative its electrodes, and piezoelectrically generates a stepped-up output voltage.

19 Claims, 6 Drawing Sheets

MULTILAYER PIEZOELECTRIC TRANSFORMER

This application claims priority from Provisional Application 60/171,957 filed Dec. 23, 1999.

BACKGROUND OF INVENTION

1. Field of Invention

The present invention relates generally to a voltage converter using layers of piezoelectric ceramic. More specifically, the present invention relates to a multilayer piezoelectric transformer using the longitudinal resonant vibration mode for step-up voltage conversion applications.

2. Description of the Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. Furthermore, in view of high frequency applications, the electromagnetic transformer has many disadvantages involving magnetic material of the electromagnetic transformer, such as sharp increase in hysteresis loss, eddy-current loss and conductor skin-effect loss. Those losses limit the practical frequency range of magnetic transformers to not above 500 kHz.

To remedy this and many other problems of the wire-wound transformer, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and thickness of materials of construction of the transformer including the piezoelectric ceramics and electrodes. Furthermore PTs have a number of advantages over general electromagnetic transformers. The size of PTs can be made much smaller than electromagnetic transformers of comparable transformation ratio, PTs can be made nonflammable, and produce no electromagnetically induced noise.

Figure 1:
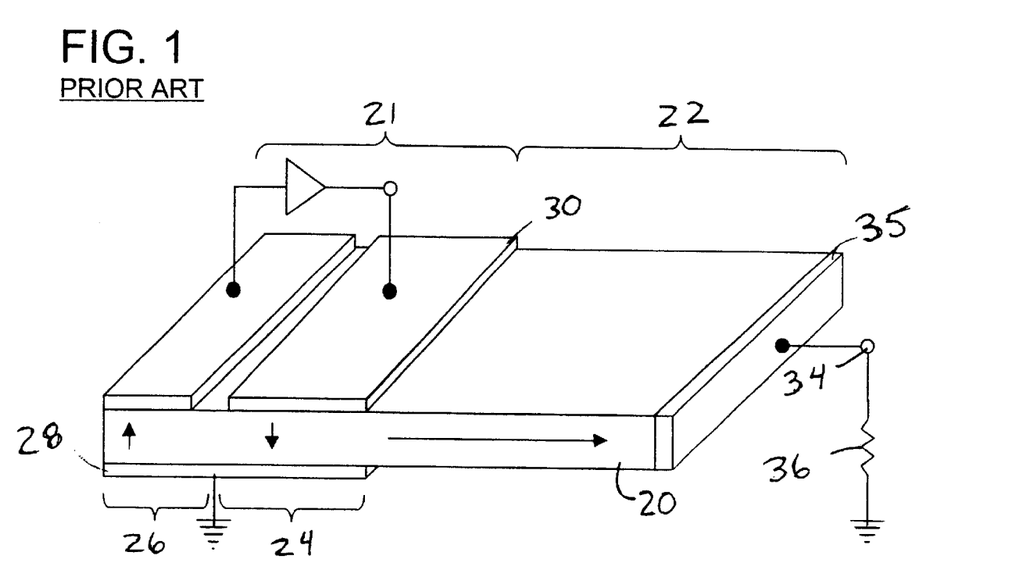
FIG. 1 is a partially schematic perspective view of a typical Rosen type piezoelectric transformer of the prior art.
Figure 2:
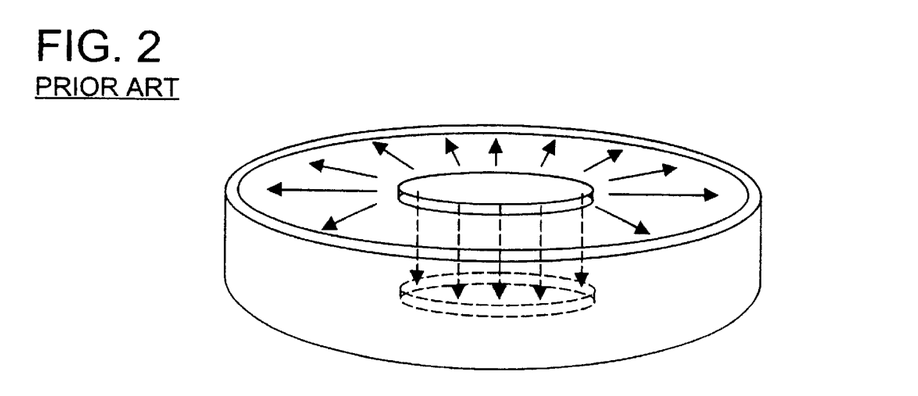
FIG. 2 is a perspective view of another example of a Rosen type piezoelectric transformer of the prior art.

The ceramic body employed in PTs takes various forms and configurations, including rings, flat slabs and the like. Typical examples of a prior PTs are illustrated in FIGS. 1 and 2. This type of PT is commonly referred to as a "Rosen-type" piezoelectric transformer. The basic Rosen-type piezoelectric transformer was disclosed in U.S. Pat. No. 2,830,274 and numerous variations of this basic apparatus are well known in the prior art. The typical Rosen-type PT comprises a flat ceramic slab 20 appreciably longer than it is wide and substantially wider than it is thick. In the case of FIG. 1, the piezoelectric body 20 is in the form of a flat slab that is considerably wider than it is thick, and having greater length than width.

As shown in FIG. 1, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the face of the slab (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode (d31 mode). The transverse effect mode vibration in the low impedance vibrator portion 21 in turn excites a vibration in the high impedance generator portion 22 in a longitudinal effect longitudinal vibration mode (g33 mode). As the result, high voltage output is obtained between electrode 28 and 35. On the other hand, for obtaining output of step-down voltage, as appreciated, the high impedance portion 22 undergoing longitudinal effect mode vibration may be used as the input and the low impedance portion 21 subjected to transverse effect mode vibration as the output.

An inherent problem of such prior PTs is that they have relatively low power transmission capacity. This disadvantage of prior PTs relates to the fact that little or no mechanical advantage is realized between the vibrator portion 21 of the device and the driver portion 22 of the device. Because the driver and vibrator portions each is intrinsically a part of the same electroactive member, the transmission of energy between portions is limited to Poisson coupling. This inherently restricts the mechanical energy transmission capability of the device, which, in turn, inherently restricts the electrical power handling capacity of such devices.

Additionally, even under resonant conditions, because the piezoelectric voltage transmission function of Rosen-type PTs is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low. Because the power transmission capacity of such prior PTs is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer.

In addition, with the typical Rosen transformer, it is generally necessary to alternately apply positive and negative voltages across opposing faces of the vibrator portion 21 of the member in order to "push" and "pull", respectively, the member into the desired shape. Even under resonant conditions, prior electrical circuits that incorporate such prior PTs are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability. In order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Also generally known are PTs polarized and vibrating in the thickness direction (i.e., vibrations are parallel to the direction of polarization of the layers). Illustrative of such thickness mode vibration PTs is the device of U.S. Pat. No. 5,118,982 to Inoue shown in FIG. 3. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

Figure 3:
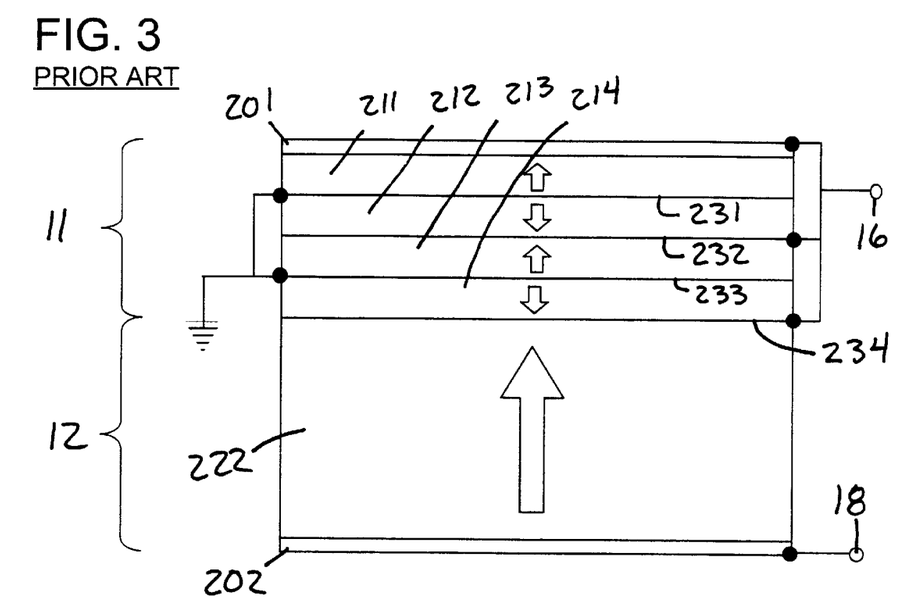
FIG. 3 is a perspective view of a typical multi-layer thickness mode vibration piezoelectric transformer of the prior art.

The thickness mode PT of FIG. 3 comprises a low impedance vibrator portion 11 including a plurality of piezoelectric layers 211 through 214 and a high impedance vibrator portion 12 including a piezoelectric layer 222, each of the layers being integrally laminated, and caused to vibrate in thicknessextensional mode. The low impedance portion 11 has a laminated structure which comprises multilayered piezoelectric layers 211 through 214 each being interposed between electrodes including the top surface electrode layer 201 and internal electrode layers 231 through 234. The high impedance portion 12 is constructed of the bottom electrode layer 202, an internal electrode layer 234 and a single piezoelectric layer 122 interposed between both electrode layers 202 and 234. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness. The PT has a common electrode 234 to which one terminal 16 of each portion is connected. The total thickness of the PT of FIG. 3 is restricted to a half wavelength (lambda/2) or one full wavelength (lambda) of the drive frequency.

When an alternating voltage is applied to the electrode layers across the ceramic layer of the vibrator portion 11, a vibration is excited in the ceramic parallel to the direction of the polarization of the layers in the longitudinal vibration mode (d33 mode). This vibration of the low impedance portion 11 excites a vibration (g33 mode) in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode with a resonance of lambda/2 mode (both end free fundamental mode) or lambda mode (both end-free secondary mode), the PT may operate in a frequency range of 1–10 MHz.

Figure 4:
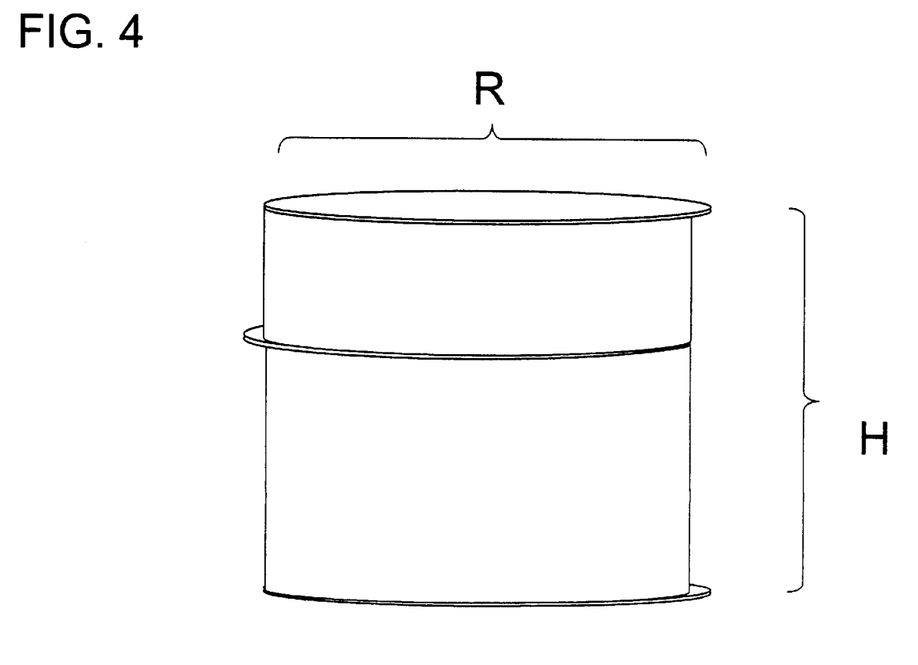
FIG. 4 is a perspective view of a cylindrical piezoelectric transformer having a radius to height ratio close to unity.

Referring now to FIG. 4: It is characteristic of PTs that they preferably vibrate in a resonant mode predominantly along one plane or direction (i.e., radial or longitudinal planes, and thickness or longitudinal directions). A problem occurs with PTs when the ratio between the longitudinal or radial dimension is close to the thickness dimension. When the ratio between the height H and the radius R of the PT are close to unity, then radial or longitudinal mode resonant frequency and thickness mode resonant frequency are also close to each other. When the resonant frequencies are very close to each other, then the vibrations interfere with each other. This leads to aberrant vibrational modes that reduce the efficiency of these PTs.

Another problem with prior thickness mode PTs is that the thickness mode resonant frequency is too high for some applications.

Another problem with prior thickness mode and Rosen PTs is that they do not have a sufficient power transmission capacity for some applications.

Another problem with prior thickness mode and Rosen PTs is that the addition of layers makes the PT profile (height) too high to be placed within miniaturized circuits.

Another problem with prior thickness mode PTs is that the addition of layers makes the thickness dimension to close to the longitudinal or radial dimensions.

Another problem with prior thickness mode PTs is that the addition of layers to the PT does not significantly raise the power density of such devices and may increase capacitive and dielectric losses.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer that is a low profile (height to length ratio) as compared to prior piezoelectric transformers that have similar power transmission capacities.

It would also be desirable to provide a piezoelectric transformer with a significant difference between dimensions in thickness and longitudinal dimensions thereby reducing aberrant vibrational modes It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

SUMMARY OF THE INVENTION

According to the present invention, there is provided a piezoelectric transformer (PT) preferably operating at its natural (i.e. "resonant") frequency to convert a transformer input signal of a first character (i.e. voltage, frequency and current) to a transformer output signal of a second character (i.e. voltage, frequency and current). The disclosed PT efficiently accomplishes the described signal conversion by subjecting the input "driver" section of the PT to an alternating voltage (or in certain embodiments a pulsed voltage) which causes the input portion(s) to deform and vibrate, which in turn causes the output portion(s) to vibrate, which in turn causes the "driven" output portion of the PT to deform, and which in turn generates an output voltage at the driven section of the transformer.

The preferred embodiment of the invention provides a multi-layer piezoelectric transformer PT. The PT has a bar-shaped input PZT layer which is bonded to an insulation layer on one of its major faces. The input layer is electroded on both major faces and is poled between the electrodes perpendicular to the input layer's major faces (in the thickness direction). Application of an alternating voltage causes the input layer to expand and contract depending on the polarity of the voltage. In an alternate embodiment the input portion comprises multiple layers which may be operated in a "push-pull" mode using positive voltage input pulses.

The output layer of the PT comprises another bar-shaped layer of PZT bonded along a major face to the other side of the insulator layer. The output layer has electrodes on two opposing minor faces and a central electrode parallel to the minor faces. The to output layer is poled in the direction perpendicular to the minor faces of the output layer, preferably towards the central electrode. A longitudinal deformation of the input layer causes a deformation of the output layer in the thickness direction, which generates the output voltage across the output electrodes.

Accordingly, it is an object the present invention to provide a PT design that has a higher power transmission capacity than similarly sized prior PTs.

It is another object of the present invention to provide a PT of the character described that has a smaller size and a lower profile than prior PTs that have similar power transmission capacities.

It is another object of the present invention to provide a PT of the character described in which the "driver" portion of the device and the "driven" portion of the device are not the same electro-active element.

It is another object of the present invention to provide a PT of the character described that develops a substantial mechanical advantage between the driver portion of the device and the driven portion of the device.

It is another object of the present invention to provide a PT of the character described that minimizes or eliminates interference between the longitudinal and thickness resonant vibrational modes.

It is another object of the present invention to provide an alternate embodiment of a multilayer PT of the character described that may be operated with positive only inputs.

It is another object of the present invention to provide an alternate embodiment of a multilayer PT of the character described that may be operated with a one hundred percent duty cycle.

It is another object of the present invention to provide a PT of the character described that is relatively less expensive to manufacture than prior PTs that perform comparable signal transformation functions.

It is another object of the present invention to provide a PT of the character described that vibrates with a lower frequency and may achieve a higher gain than prior PTs.

It is another object of the present invention to provide a PT of the character described and that is simpler to manufacture than prior PTs having a laminate structure.

It is another object of the present invention to provide a PT of the character described that has fewer losses due to capacitive and dielectric losses.

It is another object of the present invention to provide a PT that generates less heat than prior PTs, and thereby has reduced losses due to heat.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

In the present invention, a multilayer piezoelectric transformer is provided using the longitudinal mode resonant vibrations for step-up voltage conversion applications. Typical PTs utilize a multilayer construction in attempting to provide greater voltage gain and power to circuit applications. The transformation ratio is typically substantially proportional to the square of impedance ratio between the input and output portions. Therefore, attempts have been made in prior PTs to increase gain by making the output layer thicker. There is however a practical limit to the efficacy of adding ceramic layers and after a certain point, additional layers do not contribute to the gain of the PT.

Furthermore, added layers may bring the ratio between the thickness dimension and the longitudinal or radial dimension too close to unity. The present invention allows for increased gain by increasing the impedance ratio between the output and input sections of the PT without unduly increasing the thickness dimension.

A high voltage PT is provided which has high voltage output while still providing a low profile device. A low profile device is necessary because as the ratio of the thickness to the diameter or length of a PT approaches 1, the planar/radial resonance mode and the thickness resonant mode vibrations interfere with each other. The present configuration of PT minimizes the interference of resonant modes with the following design.

Figure 5:
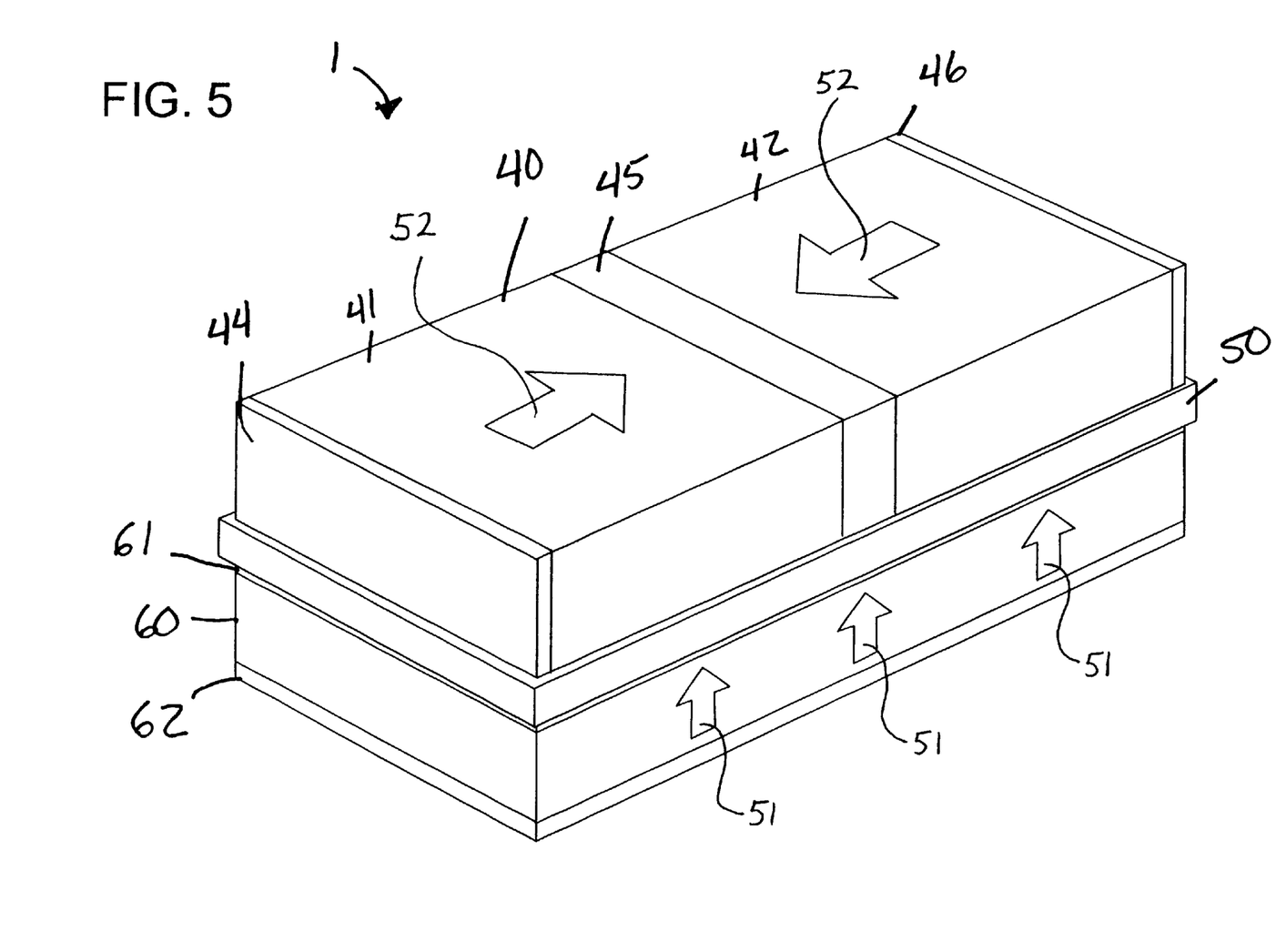
FIG. 5 is a perspective view of the preferred embodiment of the piezoelectric transformer of the present invention with a bar-shaped configuration.

Referring now to FIG. 5: The PT 1 comprises an input layer 60 comprising a thin layer of an electroactive material, preferably PZT with electrodes (silver and/or nickel) electro-deposited thereon. Preferably, when restricted to a specified width of transformer, the input layer 60 is rectangular or bar-shaped rather than circular in order to take advantage of the lower resonant frequency longitudinal mode rather than the radial mode vibration. The input layer 60 is also preferably substantially longer than it is wide, (for example 1.5 times, and preferably 3 or more times as long), and substantially wider than it is thick (for example 1.5 or more times wider). These dimensions ensure that the device's resonant frequency is the lower frequency longitudinal mode related to the length of the device rather than to the width or thickness of the device.

Electrodes 61 and 62 are provided on the two major faces of the input layer 60. The electrodes 61 and 62 preferably each comprise a copper foil. Bonding of the input layer 60 to the electrodes 61 and 62 is preferably achieved with "Ciba-Geigy AV118" (CIBA) as manufactured by Ciba Specialty Chemicals Corporation, N.A. of East Lansing, Mich.

The input layer is polarized in the thickness direction, i.e., in a direction perpendicular to the input electrodes 61 and 62 on the major faces of the input layer 60 as indicated by arrows 51. This polarization is such that when a voltage is applied across the input electrodes 61 and 62, the input layer 60 will deform in the longitudinal direction, i.e., a d31 mode deformation in a direction parallel to the planes of electrodes 61 and 62. An electrode 61 or 62 of the input layer 60 is bonded to an insulating layer 50, preferably comprising a layer of alumina. The electrode 61 or 62 is preferably bonded to the insulating layer 50 using Ciba adhesive. The alumina layer 50 prevents the input electrodes 61 or 62 from contacting any of the output layer 40 or the output electrodes 44, 45 and 46. The insulator layer 50 should extend at least to the edges of the input electrode 61 or 62 to which it is bonded, and preferably extends past the edges to prevent any arcing between the input layer 60 or input electrodes 61 and 62 and the output layer 40 and its electrodes 44, 45 and 46.

The output layer 40 of the PT comprises another rectangular bar-shaped layer of electroactive material, preferably PZT.

Preferably, the thickness of the output layer 40 is relatively greater than the thickness of the input layer 60. The output layer 40 is bisected by a central output electrode 45 thus defining two substantially equal portions 41 and 42 of the output layer 40. In the preferred embodiment of the invention, the output layer 40 comprises a single bar of PZT with a central electrode bonded to and/or wrapped around the central circumferential surface of the bar. However, the output layer 40 may alternatively comprises two separate pieces 41 and 42 of PZT which are bonded at a minor face to the central electrode 45. Two outboard output electrodes 44 and 46 are bonded on the two minor faces of the output layer 40 that are parallel to the central electrode 45. The electrodes 44, 45 and 46 preferably comprise copper foil bonded to the output layer 40 using Ciba adhesive. The output layer 40 is also bonded, preferably using Ciba adhesive on a major face to the insulating alumina layer 50. Thus, in the preferred embodiment of the invention, the central electrode 45 is essentially a conductive band that wraps around the output layer 40 between the output portions 41 and 42, and in the alternative embodiment of the invention the central electrode 45 actually physically separates the two output portions 41 and 42 of the output layer 40 from each other.

Each portion 41 and 42 of the output layer 40 is polarized between its respective outboard electrode 44 or 46 towards the central electrode 45. This provides for an output layer 40 with output portions 41 and 42 that are poled longitudinally (parallel to the major face) with respect to the input layer 60. The output portions 41 and 42 are actually poled in the thickness direction with respect to their respective output electrodes 44 and 45 or 46 and 45. The output portions 41 and 42 are preferably both poled towards the central output electrode 45 as indicated by arrows 52, i.e., the positive poling potential is applied at the central electrode 45. With this poling, when a voltage is applied between electrodes 44 and 45 or between electrodes 46 and 45, the output portion 41 or 42 between those electrodes will expand or contract (depending on the polarity) between the electrodes and parallel to the direction of poling (d33 deformation). Conversely, when the output portions 41 and 42 of the output layer 40 are strained under a compressive or tensile force, a voltage is generated between the output electrodes 44 and 45 and electrodes 45 and 46.

Figure 6:
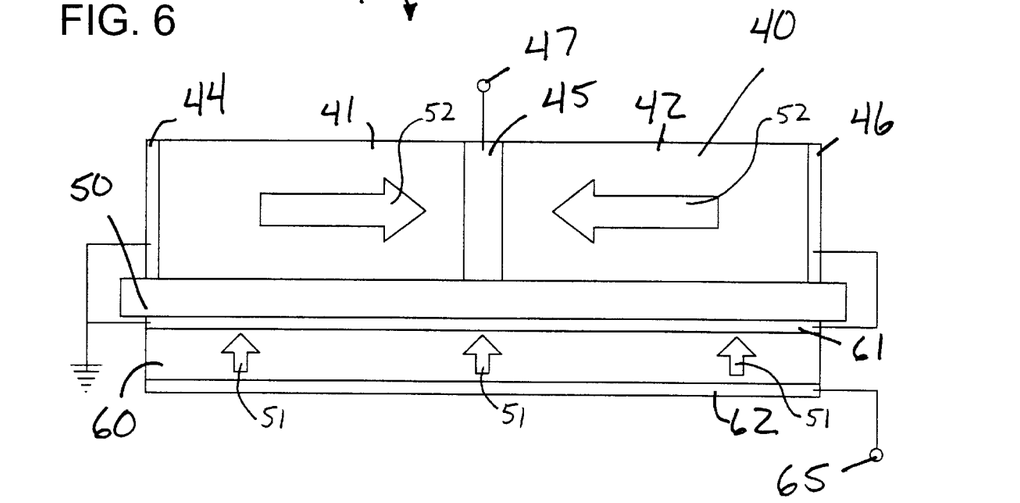
FIG. 6 is a partial schematic elevation view of the piezoelectric transformer of FIG. 6 showing the details of construction and showing the preferred electrical connections.

Referring now to FIG. 6: In the preferred embodiment of the invention, the outboard input electrode 62 is connected to an input terminal 65. The input electrode 61 bonded to the insulator 50 is connected to ground as are the outboard output electrodes 44 and 46. Output electrode 45 is connected to output terminal 47.

In operation, application of a voltage of a first polarity to input terminal 65 across the electrodes 61 and 62 of the input layer 60 causes a longitudinal d31 deformation (contraction) of the ceramic layer 60, which in turn deforms (contracts) the attached insulator layer 50 and output layer 40. The thickness deformation (contraction) of the output portions 41 and 42 of the output layer 40 piezoelectrically generates an output voltage of a first polarity in the g33 mode, between the grounded output electrodes 44 and 46 and the central output electrode 45, which is connected to output terminal 47. Conversely, application of a second voltage of a second opposite polarity to input terminal 65 across the electrodes 61 and 62 of the input layer 60 causes a longitudinal d31 mode deformation (expansion) of the ceramic layer 60, which in turn deforms (expands) the attached insulator layer 50 and output layer 40. The thickness deformation (expansion) of the output portions 41 and 42 of the output layer 40 piezoelectrically generates an output voltage of a second opposite polarity in the g33 mode, between the grounded output electrodes 44 and 46 and the central output electrode 45, which is connected to output terminal 47. Thus, application of an alternating voltage to the input layer 60 causes the input layer 60 to deform (in the d31 mode), which causes the attached insulator 50 and output layers 40 to deform (in the g33 mode), thereby generating an alternating output voltage.

Figure 7:
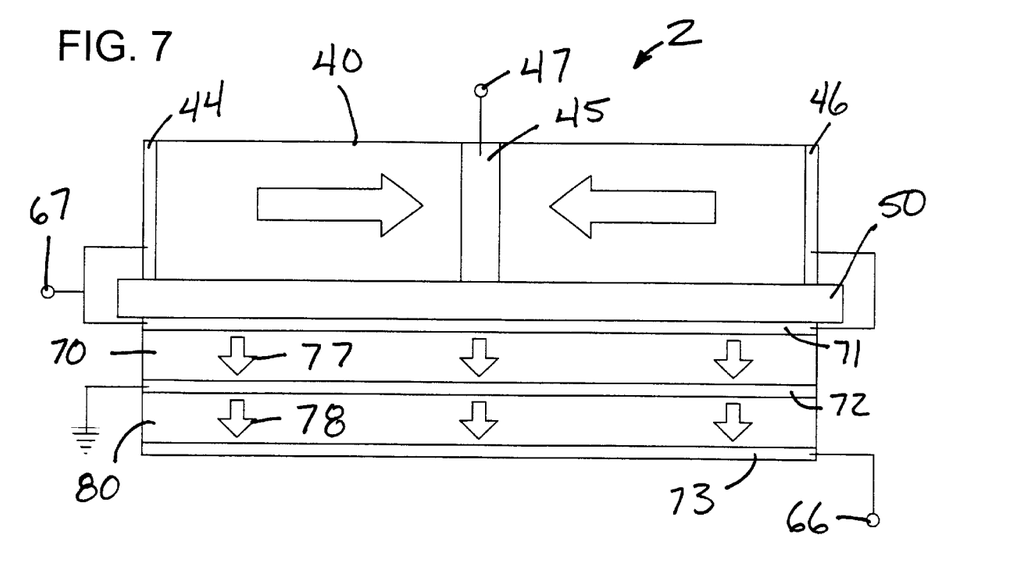
FIG. 7 is a partial schematic elevation view of an alternate embodiment of a piezoelectric transformer using two input layers and showing the preferred pulsed DC input electrical connections.

Referring now to FIG. 7: An alternate embodiment of the invention comprises another multi-layer PT 2, which is configured with a first input ceramic layer 70, a second input ceramic layer 80 and a relatively thicker output layer 40. That is the thickness of each of the input layers 70 and 80 is preferably thinner than the output layer 40. Each input layer 70 and 80 comprises a thin bar-shaped layer of electroactive material, preferably PZT with electrodes (silver and/or nickel) electro-deposited thereon. Each input layer 70 and 80 is bonded along a major face to a common electrode 72 between them. A first input electrode 71 is bonded to the remaining major face of the first input ceramic layer 70 and a second input electrode 73 is bonded to the remaining major face of the second input ceramic layer 80. The input electrodes 71, 72 and 73 preferably comprise copper foil bonded to the major faces of the input layers 70 and 80 using Ciba adhesive. The construction of the output layer 40 of the PT 2 is essentially identical to that of the output layer of the PT 1 described above and shown in FIGS. 5 and 6.

The first input electrode 71 is bonded to a first major face of an insulator layer 50, preferably comprising a thin layer of alumina. On the other major face of the insulator layer 50 is bonded the output layer 40. The insulator layer 50 extends at least to the edges of the input electrode 71 to which it is bonded, but may extend past the edges of the input layers 70 and 80 and output layer 40. The insulator layer 50 prevents electrical shorting or arcing between the input layer components (electrodes 71 and 73 and ceramic layer 70 or 80) and the output components (electrodes 44, 45 and 46 and ceramic layer 40, and particularly the central high voltage electrode 45).

Each of the input layers 70 and 80 is poled in the thickness direction so that they deform longitudinally, i.e., parallel to the major faces of the input layers 70 and 80, when a voltage is applied to a layer 70 or 80. As shown by arrows 77 and 78, the input layers 70 and 80 are poled in the same direction with respect to each other. The directions of polarization of the input layers 70 and 80 are opposite however with respect to their respective input electrodes 71 or 73 and the common electrode 72. Thus, when a positive voltage pulse is applied across the electrodes 71 and 72 of the first input layer 70 it will contract, but when the same positive voltage pulse is applied across the electrodes 73 and 72 of the second input layer 80, the second input layer will 80 expand. Alternately, a negative voltage may be applied the respective electrodes 71 and 72 or 72 and 73 of the first and second input layers 70 and 80 to have the reverse effect.

Still referring to FIG. 7: In operation, when a positive voltage pulse is applied to input terminal 67 and thereby to a first input layer 70, the first input layer 70 will expand in the d31 mode. When the first input layer 70 expands, it causes the attached output layer 40 to expand with it in the g33 mode. The expansion of the output layer 40 generates a voltage of a first polarity across the output electrodes 44, 45 and 46. When a positive voltage pulse is applied to the second input terminal 66 and thereby the second input layer 80, the second input layer 80 will contract in the d31 mode. When the second input layer 80 contracts, it causes the attached first input layer 70 and output layer 40 to contract with it in the g33 mode. The contraction of the output layer 40 generates a second output voltage (of opposite polarity than the first output voltage) across the output electrodes 44, 45 and 46. Thus, one input layer 70 pushes the layers 80, 50 and 40 in one direction during the first half cycle of operation and the other input layer 80 pulls the layers 70, 50 and 40 back during the second half cycle of operation resulting in a 100% duty cycle. The pulsed positive voltage inputs cause the input layers 70 and 80 to deform in the d31 mode, and pull and push the output layer 40 in the g33 mode to generate an alternating voltage across the electrodes 44 and 45, and electrodes 46 and 45 of the output layer 40.

Figure 8:
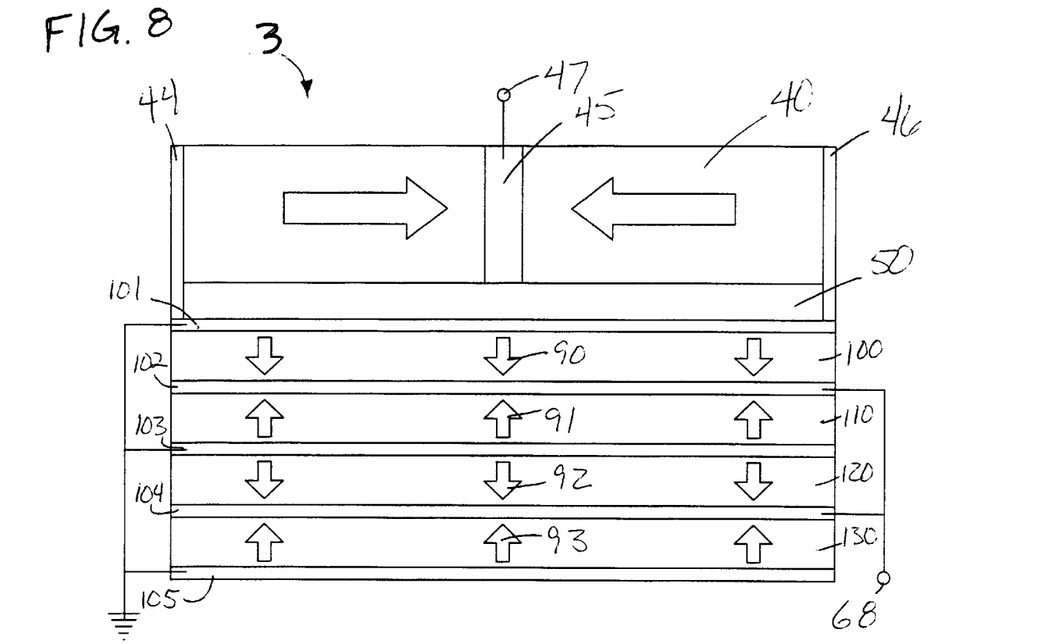
FIG. 8 is a partial schematic elevation view of an alternate embodiment of a piezoelectric transformer using 4 input layers and showing AC input electrical connections.

Referring now to FIG. 8: In yet another alternate embodiment of the invention, a multi-layer PT 3 is configured with a first input ceramic layer 100, a second input ceramic layer 110, a third input layer 120 and a fourth input layer 130, an insulator layer 50 and a relatively thicker output layer 40. Each input layer 100, 110, 120 and 130 comprises a thin bar-shaped layer of electroactive material, preferably PZT with electrodes (silver and/or nickel) electro-deposited thereon. Each input layer is bonded along each major face to an electrode, preferably comprising copper foil bonded using Ciba adhesive. More specifically, a first input electrode 101 is bonded on a first major face of the first input ceramic layer 100, and a second input electrode 102 is bonded on the remaining major face of the first input ceramic layer 100. The second input ceramic layer 110 is bonded on a major face to the second input electrode 102, and a third input electrode 103 is bonded on the remaining major face of the second input ceramic layer 110. The third input ceramic layer 120 is bonded on a major face to the third input electrode 103, and a fourth input electrode 104 is bonded on the remaining major face of the third input ceramic layer 120. The fourth input ceramic layer 130 is bonded on a major face to the fourth input electrode 104, and a fifth input electrode 105 is bonded on the remaining major face of the fourth input ceramic layer 130. Preferably, electrodes 102 and 104 are connected to input terminal 68 and electrodes 101, 103 and 105 are connected to a common ground. Alternatively, electrodes 101, 103 and 105 may be connected to input terminal 68 and electrodes 102 and 104 may be connected to a common ground, as shown in FIG. 8. The construction of the output layer 40 of the PT 3 is essentially identical to that of the output layer of the PT 1 described above and shown in FIGS. 5 and 6.

The first input electrode 101 is bonded to a first major face of an insulator layer 50, preferably comprising a thin layer of alumina and preferably using Ciba adhesive. On the other major face of the insulator layer 50 is bonded the output layer 40 preferably using Ciba adhesive. The outermost input electrodes 101 and 105 of input layers 100 or 130, respectively, are ground referenced and the outer electrodes 44 and 46 of the output layer 40 are also ground referenced. Since the outermost input electrodes 101 and 105 are ground referenced and the outer electrodes 44 and 46 of the output layer 40 are also ground referenced, these electrodes 44, 46 and 101 and 105 may come into electrical contact with one another without disadvantageously affecting the operation of the PT 3, and therefore the insulator layer need not extend past the electrodes 101 or 105 of the input layer 100 or 130, respectively. The insulator layer 50 may in the alternative extend to the edges of the input electrode 101 to which it is bonded, and may also extend past the edges of the input layers 100, 110, 120 and 130 and output layer 40. The insulator layer 50 prevents electrical shorting or arcing between the input layer electrode 101 and the output layer central high voltage electrode 45.

Each of the input layers 100, 110, 120 and 130 is poled in the thickness direction so that they deform longitudinally, i.e., in the d31 mode parallel to the major faces of the input layers 100, 110, 120 and 130, when a voltage is applied to a layer loo, 110, 120 or 130. As shown by arrows 90 and 92, the input layers 100 and 120 are poled in the same direction with respect to each other. Also, as shown by arrows 91 and 93, the input layers 110 and 130 are poled in the same direction with respect to each other. Input layers 100 and 110 are poled in opposite directions with respect to each other. However, input layers 100 and 110 are actually poled in the same direction with respect to the central input electrode 102 (i.e., towards the central input electrode 102). Likewise, input layers 120 and 130 are poled in opposite directions with respect to each other. However, input layers 120 and 130 are actually poled in the same direction with respect to central input electrode 104 (i.e., towards a central input electrode 104). Thus, when an input voltage of a first polarity is applied to input electrode 102, ceramic layers 100 and 110 will deform longitudinally in the same direction (piezoelectrically contracting in the d31 mode). When a second input voltage of an opposite polarity is applied to input electrode 102, ceramic layers 100 and 110 will deform longitudinally in the same direction (piezoelectrically expanding in the d31 mode). Furthermore, when an input voltage of a first polarity is applied to input electrode 104, ceramic layers 120 and 130 will deform longitudinally in the same direction (piezoelectrically contracting in the d31 mode). When a second input voltage of an opposite polarity is applied to input electrode 104, ceramic layers 120 and 130 will deform longitudinally in the same direction (piezoelectrically expanding in thew d31 mode). Since only one voltage source is being applied to input terminal 68, both input electrodes 102 and 104 will have the same polarity voltage applied to them and all the ceramic input layers 100, 110, 120 and 130 will piezoelectrically expand or contract simultaneously. Thus, it will be understood that application of an alternating voltage to input terminal 68 will cause all the ceramic layers 100, 110, 120 and 130 to cyclically expand and contract in the d31 mode together at the frequency of the applied voltage.

In operation the input electrodes 102 and 104 are connected to input terminal 68. The input electrode 101 bonded to the insulator 50 is connected to ground as are input electrodes 103 and 105 and the outboard output electrodes 44 and 46. Output electrode 45 is connected to output terminal 47. In operation, application of a voltage of a first polarity to input terminal 68 across the electrodes 102 and 101, 102 and 103, 104 and 103 and 104 and 105 of the input layers 100, 110, 120 and 130 respectively causes a longitudinal d31 mode deformation (contraction) of the ceramic layers 100, 110, 120 and 130, which in turn deforms (contracts) the attached insulator layer 50 and output layer 40 in the g33 mode. The thickness g33 mode deformation (contraction) of the output portions 41 and 42 of the output layer 40 piezoelectrically generates an output voltage of a first polarity between the output grounds 44 and 46 and the central output electrode 45 connected to output terminal 47. Conversely, application of a second voltage of a second opposite polarity to input terminal 68 across the electrodes 102 and 101, 102 and 103, 104 and 103 and 104 and 105 of the input layers 100, 110, 120 and 130 respectively causes a longitudinal d31 mode deformation (expansion) of the ceramic layers 100, 110, 120 and 130, which in turn deforms (expands) the attached insulator layer 50 and output layer 40 in the g33 mode. The thickness g33 mode deformation (expansion) of the output portions 41 and 42 of the output layer 40 piezoelectrically generates an output voltage of a second opposite polarity between the output grounds 44 and 46 and the central output electrode 45 connected to output terminal 47. Thus, application of an alternating voltage to the input layers 100, 110, 120 and 130 causes the input layers 100, 110, 120 and 130 to deform (in the d31 mode) which causes the attached insulator 50 and output layers 40 to deform (in the g33 mode), thereby generating an alternating output voltage.

Figure 9:
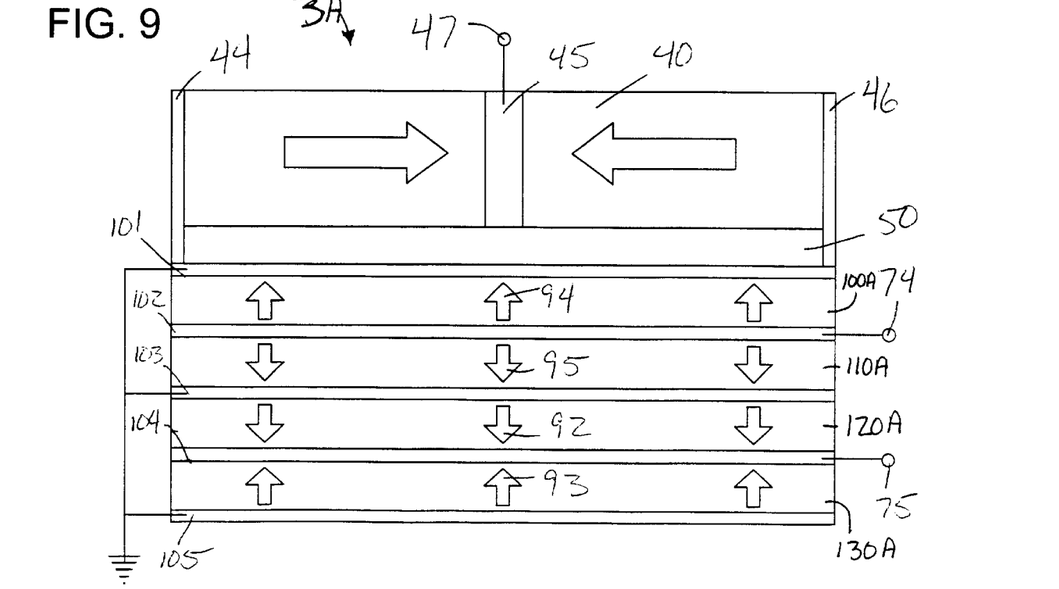
FIG. 9 is a partial schematic elevation view of an alternate embodiment of a piezoelectric transformer using 4 input layers and showing pulsed DC input electrical connections.

Referring now to FIG. 9: Alternatively, the transformer 3A may be configured to be driven by positive voltage pulses in a push-pull mode by simply reverse poling two adjacent layers and reconfiguring the input terminals. The transformer 3A of FIG. 9 is identical to the PT 3 of FIG. 8 except that the first two input layers 100A and 110A are pole away from (rather than towards) the electrode 102 between the input layers 100A and 110A, as shown by arrows 94 and 95. Also, rather than the common input terminal 68 as in FIG. 8, separate input terminals 74 and 75 are provided. Specifically, input terminal 74 is connected to the electrode 102 commonly shared by the first two input layers 100A and 110A, and terminal 75 is connected to the electrode 104 commonly shared by the second two input layers 120A and 130A. Thus, the input layers 100A and 110A are poled away from their common input electrode 102 and the other input layers 120A and 130A are poled towards their common input electrode 104. Thus, when a positive voltage pulse is applied across pairs of electrodes 102 and 101, and electrodes 102 and 103 of the first pair of input layers lOOA and 110A they will expand in the d31 mode, but when the same positive voltage pulse is applied across pairs of electrodes 104 and 103, and electrodes 104 and 105 of the second pair of input layers 120A and 130A, input layers 120A and 130A will contract in the d31 mode. Alternately, a negative voltage may be applied the respective electrodes to have the reverse effect.

In operation, when a positive voltage pulse is applied to input terminal 74 and thereby across the first and second input layers 100A and 110A, and the layers 100A and 110A expand in the d31 mode. When the first pair of input layers 100A and 110A expand, it causes the attached output layer 40 to expand with them in the g33 mode. The g33 mode expansion of the output layer 40 generates a voltage of a first polarity across the output electrodes 44, 45 and 46. When a positive voltage pulse is applied to the second input terminal 75 and thereby the third and fourth input layers 120A and 130A, the layers 120A and 130A contract in the d31 mode. When the second pair of input layers 120A and 130A contract, it causes the attached output layer 40 to contract with them in the g33 mode. The g33 mode contraction of the output layer 40 generates a second output voltage (of opposite polarity than the first output voltage) across the output electrodes 44, 45 and 46. Thus one pair of input layers 100A and 110A piezoelectrically expands in the d31 mode and pushes the other layers 120A, 130A, 50 and 40 in one direction during the first half cycle of operation and the other pair of input layers 120A and 130A piezoelectrically contracts in the d31 mode and pulls the other layers 100A, 110A, 50 and 40 back during the second half cycle of operation resulting in a 100% duty cycle. The pulsed positive voltage inputs to the input layers 100A, 110A, 120A and 130A cause d31 mode deformations that pull and push the output layer 40 in the g33 mode to generate an alternating voltage across the electrodes 44 and 45, and 46 and 45 of the output layer 40.

Figure 10:
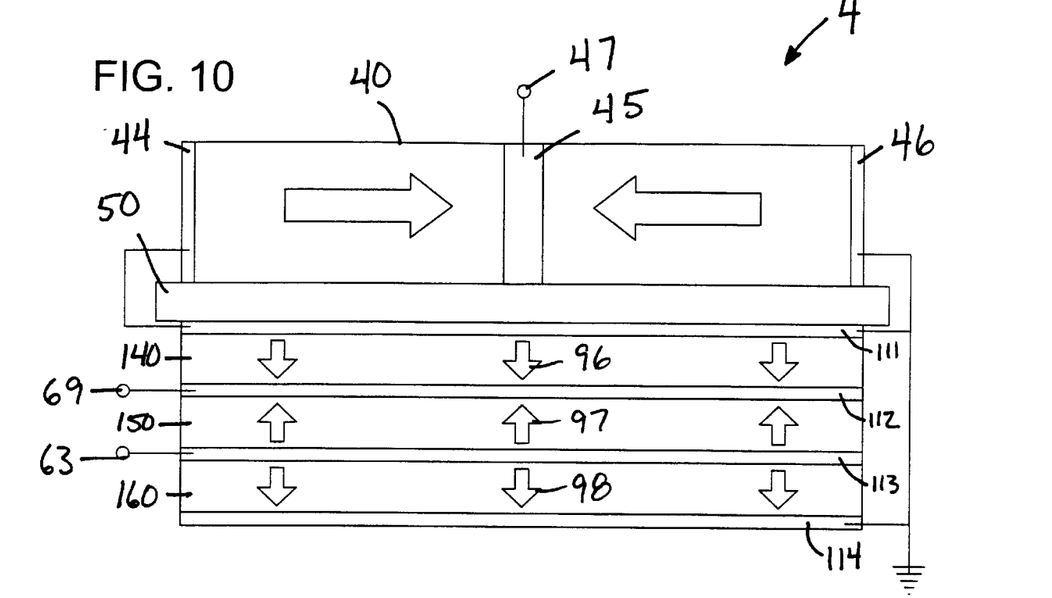
FIG. 10 is a partial schematic elevation view of an alternate embodiment of a piezoelectric transformer using three input layers and showing pulsed DC input electrical connections.

Referring to FIG. 10: An alternate embodiment of the invention comprises another multi-layer PT 4 which is configured with three input layers 140, 150 and 160, an insulator layer 50 and a relatively thicker output layer 40. Each input layer 140, 150 and 160 comprises a thin bar-shaped layer of electroactive material, preferably PZT that has electrodes (silver and/or nickel) electro-deposited thereon. Each input layer 140, 150 and 160 is bonded along each major face to an electrode, preferably copper foil bonded using Ciba adhesive. More specifically, a first input electrode 111 is bonded on a first major face of the first input ceramic layer 140, and a second input electrode 112 is bonded on the remaining major face of the first input ceramic layer 140. The second input ceramic layer 150 is bonded on a major face to the second input electrode 112, and a third input electrode 113 is bonded on the remaining major face of the second input ceramic layer 140. The third input ceramic layer 160 is bonded on a major face to the third input electrode 113, and a fourth input electrode 114 is bonded on the remaining major face of the third input ceramic layer 160. Preferably, electrode 112 is connected to input terminal 69 and electrode 113 is connected to input terminal 63, and electrodes 111 and 114 are connected to a common ground. The construction of the output layer 40 of the PT 4 is essentially identical to the output layer of the PT 1 described above and shown in FIGS. 5 and 6.

The first input electrode 111 is bonded a first major face of an insulator layer 50, preferably comprising a thin layer of alumina bonded using Ciba adhesive. On the other major face of the insulator layer 50 is bonded the output layer 40, also preferably using Ciba adhesive. The outermost input electrodes 111 and 114 of input layers 140 and 160 are ground referenced and the outer electrodes 44 and 46 of the output layer 40 are also ground referenced. The insulator layer 50 may extend to the edges of the input electrode 111 to which it is bonded, and may also extend past the edges of the input layers 140, 150 and 160 and output layer 40. The insulator layer 50 prevents electrical shorting or arcing between the input layer electrodes 111 or 114 and the output layer central high voltage electrode 45. In the alternative, since the outermost input electrodes 111 and 114 are ground referenced and the outer electrodes 44 and 46 of the output layer 40 are also ground referenced, these electrodes 44, 46 and 111 or 114 may come into electrical contact with each other without disadvantageously affecting the operation of the PT 4, and therefore the insulator layer need not extend past the electrodes 111 or 114 of the input layer 140 or 160.

Each of the input layers 140, 150 and 160 is poled in the thickness direction so that they deform longitudinally in the d31 mode, i.e., parallel to the major faces of the input layers 140, 150 and 160, when a voltage is applied to a layer 140, 150 or 160. As shown by arrows 96 and 98, the input layers 140 and 160 are poled in the same direction with respect to each other. In addition, as shown by arrow 97, the input layer 150 is poled in the opposite direction with respect to layers 140 and 160. However, input layer 150 is actually poled in the same direction as input layer 140 with respect to the input electrode 112 (i.e., towards the input electrode 112) between the layers 140 and 150. Also, input layer 150 is poled in the same direction as input layer 160 with respect to the input electrode 113 (i.e., away from the input electrode 113) between the layers 150 and 160.

Thus, when a positive voltage pulse is applied to input terminal 69, the voltage will be applied across electrodes 112 and 111 of input layer 140 which will expand in the d31 mode and across electrodes 112 and 113 of input layer 150 which will also expand in the d31 mode. When the same positive voltage pulse is applied to input terminal 63, the voltage will be applied across electrodes 113 and 114 of input layer 160 which will contract in the d31 mode and across electrodes 113 and 112 of input layer 150 which will also contract in the d31 mode. Alternately, a negative voltage pulse may be applied the respective electrodes 112 and 111, 112 and 113, 113 and 114 and 113 and 112, of the three input layers 140, 150 and 150 to have the reverse effect.

In operation, when a positive voltage pulse is applied to the first input terminal 69, input layers 140 and 150 expand in the d31 mode. When the input layers 140 and 150 expand, the attached output layer 40 expands with them in the g33 mode. The g33 mode expansion of the output layer 40 generates a voltage of a first polarity across the output electrodes 44, 45 and 46. When a positive voltage pulse is applied to the second input terminal 63, input layers 150 and 160 contract in the d31 mode. When the input layers 150 and 160 contract in the d31 mode, the attached output layer 40 contracts with them in the g33 mode. The g33 mode contraction of the output layer 40 generates a second output voltage (of opposite polarity than the first output voltage) across the output electrodes 44, 45 and 46. Thus one pair of input layers 140 and 150 pushes the layers 160, 50 and 40 in one direction during the first half cycle of operation and the other pair of input layers 150 and 160 pulls the layers 140, 50 and 40 back during the second half cycle of operation resulting in a 100% duty cycle. Because the center input layer 150 is poled in the same direction as the other input layers 140 or 160 with respect to their shared input electrodes 112 or 113, the central layer 150 may both push and pull the other layers 140 and 160. Thus, the pulsed positive voltage inputs to the input layers 140, 150 and 160 piezoelectrically expand and contract in the d31 mode, and pull and push the output layer 40 in the g33 mode to generate an alternating voltage across the electrodes 44 and 45, and 46 and 45 of the output layer 40.

Figure 11:
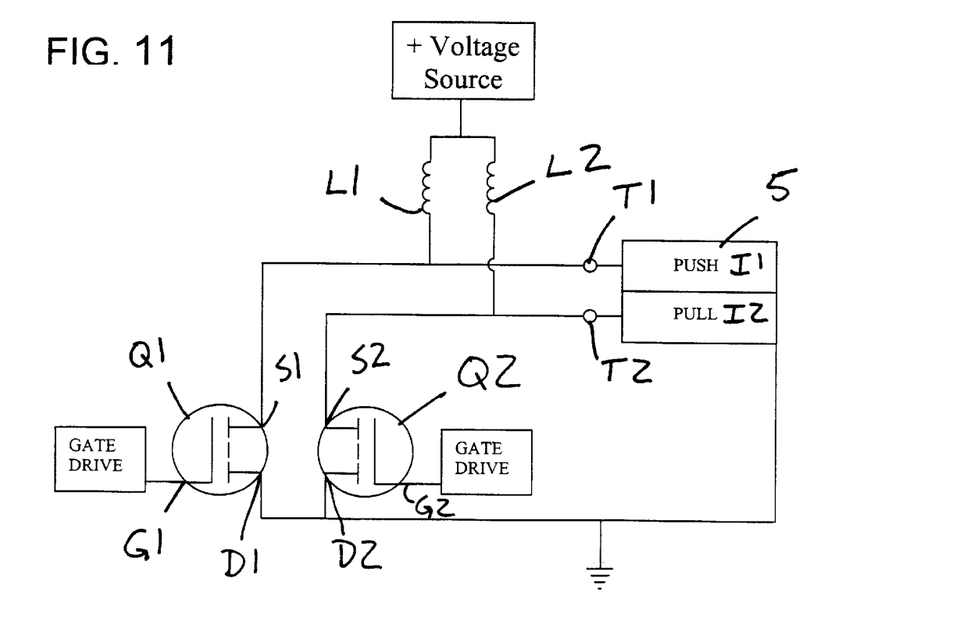
FIG. 11 is a partial schematic of the preferred circuit for applying a pulsed DC input to the two input terminal transformers of FIGS. 7, 9 and 10.

Referring now to FIG. 11: The circuit of FIG. 11 is representative of a circuit for providing the positive input voltage pulses to the push-pull transformers having two input terminals. The PT 5 in the circuit represents any of the above described PTs 2, 3A and/or 4 (shown in FIGS. 7, 9 and 10 respectively) which are push-pull transformers having two input terminals. The transformer 5 is driven by a circuit containing two inductors L1 and L2 and two FETS Q1 and Q2. Specifically, a positive voltage input is linked to the input electrode(s) connected to one input terminal T1 via an inductor L1. The first input terminal T1 is for applying voltage pulses to a first input section I1 of the transformer 5. The positive voltage input is also linked to the other input electrode(s) connected to a second input terminal T2 via a second inductor L2. The second input terminal T2 is for applying voltage pulses to a second input section I2 of the transformer 5. As illustrated in FIG. 11, section I1 is the section of the transformer 5 that expands or pushes the other sections of the transformer 5 and section I2 is the section of the transformer 5 that contracts or pulls the other sections of the transformer 5. Alternatively, I1 may pull and I2 may push, or input layers of the transformer 5 may overlap in space and function as layer 150 in the transformer 4 of FIG. 10.

A FET is also connected to each input terminal T1 and T2. More specifically, the source S1 of a FET Q1 is electrically connected to inductor L1 and input terminal T1. The drain D1 of the FET Q1 is connected to ground as are the ground wires of the transformer 5. This places the input layer(s) of section I1 of the transformer 5 in parallel with the source S1 and Drain D1 of the first FET Q1. Also, the source S2 of a second FET Q2 is electrically connected to inductor L2 and input terminal T2. The drain D2 of the FET Q2 is connected to ground as are the ground wires of the transformer 5. This places the input layer(s) of section I2 of the transformer 5 in parallel with the source S2 and drain D2 of the second FET Q2.

Each FET Q1 and Q2 has a gate drive connected to their respective gates G1 and G2 operating such that when the gate G1 of FET Q1 is de-energized, the gate G2 of FET Q2 is energized and when the gate G2 of FET Q2 is de-energized, the gate G1 of FET Q1 is energized. When the gate G1 of the first FET Q1 is energized, current will flow from the source S1 to the drain D1, storing energy in the magnetic field of inductor L1. When the first FET Q1 is de-energized, the magnetic field in the inductor L1 collapses and a positive voltage pulse is applied to input terminal T1, which causes the first input section I1 to expand, pushing the other layers of the transformer 5. Also, when the gate G2 of the second FET Q2 is energized, current will flow from the source S2 to the drain D2, storing energy in the magnetic field of inductor L2. When the second FET Q2 is de-energized, the magnetic field in the inductor L2 collapses and a positive voltage pulse is applied to input terminal T2, which causes the second input section I2 to contract, pulling the other layers of the transformer 5. Thus, by alternatingly driving the gates G1 and G2 of FETs Q1 and Q2 such that one gate G1 or G2 is energized and the other is de-energized, a series of positive voltage pulses may be alternatingly applied to the input sections I1 and I2 of the transformer 5 to drive the transformer 5 in a push-pull mode. This circuit provides a 100% duty cycle for driving the push-pull input sections I1 and I2 of the transformer 5. Furthermore, the drive circuit has to support only half the current resulting in lower losses, greater efficiency and lower cost components.

Whether driving the above-described transformers with an AC voltage input (as the PTs 1 and 3 of FIGS. 5,6 and 8) or applying pulsed DC voltage inputs (as for the two-input terminal PTs 2, 3A and 4 of FIGS. 7, 9 and 10), it is preferable to drive the PTs at their natural resonant frequency. This is because greater deformation of the layers occurs while operating at resonance and therefore, greater voltage gains are realized. Preferably, the PTs are driven at the longitudinal resonant frequency of the input and output layers' longest dimension, in order that the d31 deformation of the input layer(s) may induce a g33 deformation in the output layer 40. Deformation of the output layer 40 in the g33 mode along this longitudinal axis provides the greatest voltage gains because the impedance of the output layer 40 is greatest along that axis. Since the resonant frequency is chosen to be along the longitudinal dimension of the PTs, it is preferred that that dimension correspond to an integral number of half wavelengths of the driving frequency. In other words, each input layer should correspond to an integral multiple of half wavelengths of the driving frequency. Also, each portion of the output layer should correspond to an integral multiple of half wavelengths of the driving frequency. Also, because the longitudinal dimension of the PTs is the longest dimension, the resonant frequency along that dimension corresponds to the lowest driving frequency. Greater deformation and therefore higher voltage gains are associated with the lower frequency deformation. Thus, it is preferred to apply the AC voltage input or the pulsed DC voltage inputs at a frequency corresponding to the natural longitudinal resonant frequency of the PT.

While the above description contains many specificities, these should not be construed as limitations on the scope of the invention, but rather as exemplification of preferred embodiments thereof. Many other variations are possible, for example:

The ceramic layers are preferably constructed of a PZT ceramic material, other electroactive materials may be used in its place;

The ceramic layers can be piezoelectric, ferroelectric or other electroactive elements;

The input portion may comprise as few as one ceramic layer or may be of a multi-layer construction;

The shape of the PT need not be rectangular bar-shaped, and many other shapes or configurations are possible;

The direction of polarization of the input layers can vary and need not be toward the central electrode, but may be away from the central electrode or combinations thereof;

The direction of polarization of the output layer need not be toward from the central electrode, but may be away the central electrode;

The central electrode of the output layer need not be the high voltage electrode—the outer electrodes may carry the high voltage and the central electrode may be ground referenced;

The insulating layer need not be constructed of alumina, but may be constructed of other insulating materials.

The insulating layer need not extend to the edges or past the edges, but may simply be large enough to isolate the high voltage electrode from the input or ground electrodes.

Accordingly, the scope of the invention should be determined not by the embodiment illustrated, but by the appended claims and their legal equivalents.

I claim:

1. A piezoelectric transformer, comprising:

a first input electroactive layer having first and second opposing electroded major faces and first and second opposing minor faces and polarized such that upon application of voltage across said first and second opposing electroded major faces, said first input electroactive layer deforms in a longitudinal direction parallel to said first and second opposing electroded major faces and perpendicular to said first and second opposing minor faces;

an output electroactive layer having first and second opposing major faces, first and second opposing electroded minor faces, third and fourth opposing minor faces, and a central output electrode bonded to said output electroactive layer between said first and second opposing electroded minor faces;

said output electroactive layer having a first output portion between said central output electrode and said first electroded minor face, said first output portion being polarized in a direction normal to said first electroded minor face;

said output electroactive layer having a second output portion between said central output electrode and said second electroded minor face, said second output portion being polarized in a direction normal to said second electroded minor face; and a dielectric layer having first and second opposing major faces;

said first major face of said dielectric layer being bonded to said first electroded major face of said input electroactive layer;

said second major face of said dielectric layer being bonded to said first major face of said output electroactive layer;

wherein upon application of a voltage across said first and second electroded major faces of said input electroactive layer, said input electroactive layer deforms in said longitudinal direction;

and wherein upon said longitudinal deformation of said input electroactive layer, said bonded dielectric layer and said output electroactive layer mechanically strain in said longitudinal direction;

and wherein said mechanical strain of said output electroactive layer in said longitudinal direction piezoelectrically generates a first output voltage between said first electroded minor face and said central output electrode and a second output voltage between said second electroded minor face and said central output electrode.

2. The piezoelectric transformer of claim 1, wherein a first distance between said central output electrode and said first or second electroded minor face is greater than a second distance between said first and second opposing major faces of said output electroactive layer.

3. The piezoelectric transformer of claim 2, wherein said direction of poling of said first output portion is opposite said direction of poling of said second output portion.

4. The piezoelectric transformer of claim 3, wherein said central output electrode comprises an electrode layer substantially bisecting said output electroactive layer in a plane parallel to said first and second electroded minor faces.

5. The piezoelectric transformer of claim 3, wherein said central output electrode comprises a conductive band encircling a portion of said output electroactive layer on said first and second opposing major faces and said third and fourth minor faces, said encircled portion being substantially equidistant from each of said first and second electroded minor faces.

6. The piezoelectric transformer of claim 5, further comprising:
means for applying a first voltage of a first polarity across said first input electroactive layer, wherein application of said first voltage deforms said first input electroactive layer in a first direction parallel to said longitudinal direction; and
means for applying a second voltage having a second polarity opposite said first polarity across said first input electroactive layer, wherein application of said second voltage deforms said first input electroactive layer in a second opposite direction parallel to said longitudinal direction.

7. The piezoelectric transformer of claim 5, further comprising:
a second input electroactive layer having first and second opposing electroded major faces and polarized such that upon application of a voltage is across said first and second opposing electroded major faces, said second input electroactive layer deforms in said longitudinal direction parallel to said first and second opposing major faces;
said first electroded major face of said second input electroactive layer being bonded to said second electroded major face of said first input electroactive layer.

8. The piezoelectric transformer of claim 7, further comprising:
means for applying a first voltage across said first input electroactive layer, wherein application of said first voltage deforms said first input electroactive layer in a first direction parallel to said longitudinal direction; and
means for applying a second voltage across said second input electroactive layer, wherein application of said first voltage deforms said second input electroactive layer in a second opposite direction parallel to said longitudinal direction.

9. The piezoelectric transformer of claim 7, wherein said direction of polarization of said first input electroactive layer is opposite said direction of polarization of said second input electroactive layer; and wherein said first voltage and said second voltage have the same polarity.

10. The piezoelectric transformer of claim 7, wherein said direction of polarization of said first input electroactive layer and said direction of polarization of said second input electroactive layer are the same; and wherein said first voltage and said second voltage have opposite polarities.

11. The piezoelectric transformer of claim 7, further comprising:
a third input electroactive layer having first and second opposing electroded major faces and polarized such that upon application of a voltage is across said first and second opposing electroded major faces, said third input electroactive layer deforms in said longitudinal direction parallel to said first and second opposing major faces;
said first electroded major face of said third input electroactive layer being bonded to said second electroded major face of said second input electroactive layer.

12. The piezoelectric transformer of claim 11, further comprising:
means for applying a first voltage of a first polarity across said first input electroactive layer and said second input electroactive layer, wherein application of said first voltage deforms said first input electroactive layer and said second input electroactive layer in a first direction parallel to said longitudinal direction; and
means for applying a second voltage having a second polarity opposite said first polarity across said second input electroactive layer and said third input electroactive layer, wherein application of said second voltage deforms said second input electroactive layer and said third input electroactive layer in a second opposite direction parallel to said longitudinal direction.

13. The piezoelectric transformer of claim 11, further comprising:
a fourth input electroactive layer having first and second opposing electroded major faces and polarized such that upon application of a voltage is across said first and second opposing electroded major faces, said fourth input electroactive layer deforms in said longitudinal direction parallel to said first and second opposing major faces;
said first electroded major face of said fourth input electroactive layer being bonded to said second electroded major face of said third input electroactive layer.

14. The piezoelectric transformer of claim 11, further comprising:
means for applying a first voltage across said first input electroactive layer and said third input electroactive layer, wherein application of said first voltage deforms said first input electroactive layer and said third input electroactive layer in a first direction parallel to said longitudinal direction; and
means for applying a second voltage across said second input electroactive layer and said fourth input electroactive layer, wherein application of said second voltage deforms said second input electroactive layer and said fourth input electroactive layer in a second opposite direction parallel to said longitudinal direction.

15. The piezoelectric transformer of claim 11, wherein said direction of polarization of said first input electroactive layer and said third input electroactive layer are opposite said direction of polarization of said second input electroactive layer and said fourth input electroactive layer;

and wherein said first voltage and said second voltage have the same polarity.

16. The piezoelectric transformer of claim 13, wherein said direction of polarization of said first input electroactive layer, said second input electroactive layer, said third input electroactive layer and said fourth input electroactive layer are the same;

and wherein said first voltage and said second voltage have opposite polarities.

17. The piezoelectric transformer of claim 6, wherein said means for applying said first and second voltages comprise means for applying said first and second voltages at a resonant frequency of said piezoelectric transformer;

and wherein a third distance between said first and second opposing minor faces of said first input electroactive layer comprises an integral multiple of half wavelengths of said resonant frequency of said piezoelectric transformer.

18. The piezoelectric transformer of claim 17, wherein said first distance between said central electrode and said first or second electroded minor faces comprises an integral multiple of half wavelengths of said resonant frequency of said piezoelectric transformer.

19. The piezoelectric transformer of claim 6, wherein said second distance between said first and second opposing major faces of said output electroactive layer is greater than a fourth distance between said first and second opposing major faces of said first input electroactive layer.

* * * * *